United States Patent
Zhang et al.

(10) Patent No.: US 12,153,445 B2
(45) Date of Patent: Nov. 26, 2024

(54) METHOD AND APPARATUS FOR CONTROLLING CRUISE OF UNMANNED AIR VEHICLE BASED ON PREFABRICATED CONSTRUCTION PLATFORM

(71) Applicant: CHINA CONSTRUCTION SCIENCE & TECHNOLOGY GROUP CO., LTD., Guangdong (CN)

(72) Inventors: Zhonghua Zhang, Guangdong (CN); Zesen Fan, Guangdong (CN); Shilong Su, Guangdong (CN); Xinwei Li, Guangdong (CN); Ruinan Tan, Guangdong (CN); Rong Teng, Guangdong (CN); Yunxing Chang, Guangdong (CN)

(73) Assignee: CHINA CONSTRUCTION SCIENCE & TECHNOLOGY GROUP CO., LTD., Guangdong (CN)

( * ) Notice: Subject to any disclaimer, the term of this patent is extended or adjusted under 35 U.S.C. 154(b) by 571 days.

(21) Appl. No.: 17/278,354

(22) PCT Filed: Sep. 20, 2018

(86) PCT No.: PCT/CN2018/106715
§ 371 (c)(1),
(2) Date: Mar. 22, 2021

(87) PCT Pub. No.: WO2020/056669
PCT Pub. Date: Mar. 26, 2020

(65) Prior Publication Data
US 2021/0349476 A1    Nov. 11, 2021

(51) Int. Cl.
*G05D 1/00* (2024.01)
*G06F 30/10* (2020.01)
*G08G 5/00* (2006.01)
*B64U 101/30* (2023.01)
*G05B 17/02* (2006.01)

(52) U.S. Cl.
CPC ............ *G05D 1/101* (2013.01); *G06F 30/10* (2020.01); *G08G 5/0034* (2013.01);
(Continued)

(58) Field of Classification Search
CPC .... G05D 1/101; G05D 1/0038; B64C 39/024; G05B 17/02; G06F 30/10; G08G 5/0034;
(Continued)

(56) References Cited

U.S. PATENT DOCUMENTS

2015/0294183 A1*  10/2015  Watanabe ............... G07C 9/00
                                                              382/203
2017/0012697 A1*   1/2017  Gong ..................... H04W 16/18
(Continued)

FOREIGN PATENT DOCUMENTS

CN          103824340 A      5/2014
CN          105023201 A     11/2015
(Continued)

OTHER PUBLICATIONS

International Search Report and Written Opinion for Application No. PCT/CN2018/106715, dated Jun. 19, 2019, 6 Pages (including English translation).
(Continued)

*Primary Examiner* — Abby Y Lin
*Assistant Examiner* — Karston G. Evans
(74) *Attorney, Agent, or Firm* — Brooks Kushman P.C.

(57) ABSTRACT

A method and an apparatus for controlling cruise of an unmanned air vehicle based on a prefabricated construction platform, a terminal device, and a computer readable storage medium are provided. The control method comprises: acquiring personnel information at the construction site; adjusting a cruise cycle of the unmanned air vehicle based on the personnel information; transmitting the imagery data of the construction site collected by the unmanned air
(Continued)

vehicle to the prefabricated construction platform; and completing three-dimensional modeling on the prefabricated construction platform based on the imagery data, and displaying a resulting model. In this way, the technical problem that the existing cruise method of the unmanned air vehicle has a low level of intelligence is solved.

10 Claims, 3 Drawing Sheets

(52) U.S. Cl.
CPC ....... *G08G 5/0039* (2013.01); *B64U 2101/30* (2023.01); *G05B 17/02* (2013.01); *G05D 1/0038* (2013.01)

(58) Field of Classification Search
CPC .. G08G 5/0026; G08G 5/0039; G08G 5/0052; G08G 5/006; G08G 5/0086; G08G 5/0013; G08G 5/0069; B64U 2101/30; G06T 17/05
See application file for complete search history.

(56) References Cited

U.S. PATENT DOCUMENTS

| | | | |
|---|---|---|---|
| 2017/0081026 A1 | 3/2017 | Winn et al. | |
| 2017/0334559 A1* | 11/2017 | Bouffard | G08G 5/0034 |
| 2018/0086455 A1 | 3/2018 | Burch, V et al. | |
| 2018/0174357 A1* | 6/2018 | Priest | G06T 15/205 |
| 2018/0259652 A1* | 9/2018 | Shimizu | G06T 7/70 |
| 2018/0349522 A1* | 12/2018 | Aphek | G06F 30/13 |
| 2019/0026958 A1* | 1/2019 | Gausebeck | H04N 13/10 |
| 2019/0176967 A1* | 6/2019 | Ohata | B64C 13/20 |
| 2019/0196494 A1* | 6/2019 | Kanehara | G06V 40/103 |

FOREIGN PATENT DOCUMENTS

| | | |
|---|---|---|
| CN | 105334862 A | 2/2016 |
| CN | 105513119 A | 4/2016 |
| CN | 106408254 A | 2/2017 |
| CN | 107066758 A | 8/2017 |
| CN | 107292487 A | 10/2017 |
| CN | 107305395 A | 10/2017 |
| CN | 107390613 A | 11/2017 |
| CN | 107613248 A | 1/2018 |
| CN | 107830767 A | 3/2018 |
| IN | 106441233 A | 2/2017 |

OTHER PUBLICATIONS

Wu, Siyuan, Research on the Scheduling of UAV Security Tasks—Taking Yangpu District as an Example, Kejifeng Magazine, May 2016, p. 143.

\* cited by examiner

METHOD AND APPARATUS FOR CONTROLLING CRUISE OF UNMANNED AIR VEHICLE BASED ON PREFABRICATED CONSTRUCTION PLATFORM

CROSS-REFERENCE TO RELATED APPLICATION

This application is the U.S. national phase of PCT Application No. PCT/CN2018/106715 filed on Sep. 20, 2018, which is incorporated herein by reference in its entirety.

TECHNICAL FIELD

The present application relates to the technical filed of prefabricated construction, and more particularly to a method and an apparatus for controlling cruise of an unmanned air vehicle based on a prefabricated construction platform, and a terminal device.

BACKGROUND

A prefabricated building cloud collaboration platform formed based on Internet+BIM, relies upon BIM models and cloud computing technology, breaks down various barriers and boundaries among project-related personnel, information, and processes, and realizes efficient project management and collaboration. With the rapid development of the unmanned air vehicle technology, the unmanned air vehicle is used to collect real scene images of construction sites, and transmit the real scene images to the prefabricated building cloud collaboration platform for three-dimensional modeling and displaying, so that the staff can clearly acknowledge the stage of the building in the life cycle thereof through the photograph results of the unmanned air vehicle, and acknowledge the current progress of the project, which is more efficient and convenient than the manual photographing. However, the existing cruise cycle of the unmanned air vehicle is usually preset by the staff. If the cruise cycle of the unmanned air vehicle is to be changed, the staff must modify parameters related to the cruise of the unmanned air vehicle on the prefabricated building cloud collaboration platform. Thus, the current cruise method of the unmanned air vehicle has a low level of intelligence.

SUMMARY

Technical Problems

In view of this, this application provides a method and an apparatus for controlling cruise of an unmanned air vehicle based on a prefabricated construction platform, a terminal device, and a computer readable storage medium, so as to solve the technical problem that the existing cruise method of the unmanned air vehicle has a low level of intelligence.

Technical Solutions

A first aspect of the present application provides a method for controlling cruise of an unmanned air vehicle based on a prefabricated construction platform. The unmanned air vehicle is in communication with the prefabricated construction platform. The method comprises:
  cruising, by the unmanned air vehicle, around a construction site according to an automatically planned cruise route, and collecting imagery data of the construction site;
  acquiring personnel information at the construction site;
  adjusting a cruise cycle of the unmanned air vehicle based on the personnel information;
  transmitting the imagery data of the construction site collected by the unmanned air vehicle to the prefabricated construction platform; and
  completing three-dimensional modeling on the prefabricated construction platform based on the imagery data, and displaying a resulting model.

A second aspect of the present application provides an apparatus for controlling cruise of an unmanned air vehicle based on a prefabricated construction platform. The unmanned air vehicle is in communication with the prefabricated construction platform. The apparatus comprises:
  a collection unit, configured for cruising, by the unmanned air vehicle, around a construction site according to an automatically planned cruise route, and collecting imagery data of the construction site;
  a personnel information acquisition unit, configured for acquiring personnel information at the construction site;
  an adjustment unit, configured for adjusting a cruise cycle of the unmanned air vehicle based on the personnel information;
  a transmission unit, configured for transmitting the imagery data of the construction site collected by the unmanned air vehicle to the prefabricated construction platform; and
  a modeling unit, configured for completing three-dimensional modeling on the prefabricated construction platform based on the imagery data, and displaying a resulting model.

A third aspect of the present application provides a terminal device. The terminal device comprises: a memory, a processor, and a computer program stored in the memory and running on the processor. The processor is configured for implementing the steps of the control method according to the first aspect when executing the computer program.

A fourth aspect of the present application provides a computer-readable storage medium storing a computer program. The computer program is configured to implement the steps of the method according to the first aspect when being executed by a processor.

Beneficial Effects

In view of the above, in the technical solutions of the present application, the cruise cycle of the unmanned air vehicle is adjusted according to the number of personnel at the construction site, such that the prefabricated construction platform can dynamically adjust the cruise cycle/frequency of the unmanned air vehicle according to the number of construction workers at the construction site, without the need for the staff of the prefabricated construction platform to manually modify the cruise cycle parameters of the unmanned air vehicle, thus improving the intelligent level of the cruise method of unmanned air vehicle.

BRIEF DESCRIPTION OF THE DRAWINGS

In order to more clearly illustrate the technical solutions in the embodiments of the present application, the drawings that need to be used in the description of the embodiments or the prior art will be briefly described hereinbelow. Obviously, the accompanying drawings in the following description are only some embodiments of the present application.

For those skilled in the art, other drawings can be obtained based on these drawings without creative work.

DETAILED DESCRIPTION

In the following description, for the purpose of explanation rather than limitation, specific details are set forth such as particular system architectures, techniques, etc., in order to provide a thorough understanding of the embodiments of the present application. However, it will be apparent to those skilled in the art that the present application may be implemented in other embodiments that are not particularly subject to these specific details. In other instances, detailed descriptions of well-known systems, devices, circuits, and methods are omitted so as not to obscure the description of the present application with unnecessary detail.

It will be understood that the term "comprising"/"including", when used in this specification and the appended claims, represents the presence of stated features, integers, steps, operations, elements, and/or components, but does not preclude the presence or addition of one or more other features, integers, steps, operations, elements, components, and/or combinations thereof.

It is also to be understood that the terminology used herein in the specification of the present application is for the purpose of merely describing particular embodiments and is not intended to limit the present application. As used in the specification of the present application and the appended claims, unless otherwise clearly indicated in the context, the singular forms such as "a", "an" and "the" are intended to include the plural forms.

It is also to be understood that the term "and/or" used in the specification and appended claims of this application refers to any combination and all possible combinations of one or more of the associated listed items, and includes these combinations.

First Embodiment

Figure 1:
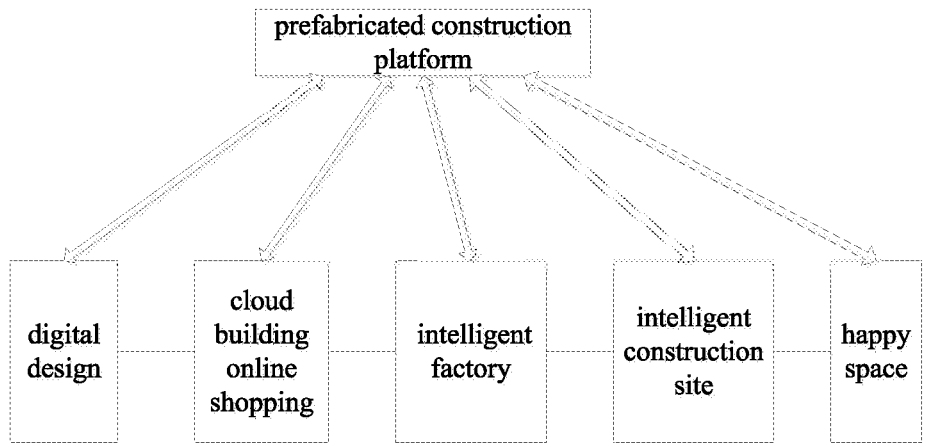
FIG. 1 is a schematic diagram of a prefabricated construction platform system provided by a first embodiment of the present application.

FIG. 1 is a structure schematic diagram of a prefabricated construction platform system provided by a first embodiment of the present application.

The prefabricated construction platform is a innovatively developed construction+Internet platform that focuses on the construction needs of three integrations (that is, the integration of design, production, and construction of the prefabricated building; the integration of architecture, structure, mechanical and electrical, and interior decoration; and the integration of technology, management, and industry), and systematically integrates technologies of BIM, Internet, Internet of Things, prefabricated construction, and so on, and conducts innovative research and development. The prefabricated construction platform includes: a digital design module, a cloud building online shopping module, an intelligent factory module, an intelligent construction site module, and a happy space module.

The digital design module includes: a project library and a component and part library. The project library is used to classify and manage all projects managed by this platform. Each project directory also includes: panorama, tower, standard floor, project component library, project part library, and other sub-directories. The components and parts library is used to classify and manage the components and parts used in all projects managed by this platform, where the components are displayed by means of a two-dimensional code, and the user can click on the two-dimensional code to display the physical image of a corresponding component, or scan the two-dimensional code by a mobile terminal thereby displaying the physical image of the component on the mobile terminal. The parts are displayed through the 3D real scene model images, and the user can rotate the 3D real scene model images of the parts on the platform terminal with the mouse, so that the 3D real scene model images can be displayed from different angles.

The cloud building online shopping module includes: a BIM cost management sub-module, and a cloud building network sub-module. The BIM cost management sub-module is used to perform cost management on all projects managed by the platform. The cost includes: civil engineering, steel structure, intelligence of weak electricity, and metal roofing cost. The cloud building network sub-module provides an interface for project-related bidding, worker recruitment, and purchase of components and parts by means of an online mall. Users can directly use the prefabricated construction platform to realize online bidding, worker recruitment, and purchase of components and parts.

The intelligent factory module includes: a PC (prestressed concrete) factory management system, a remote video monitoring system, a production plan design system, and a prefabricated component production information system. The PC factory management system is used to provide a login interface for an office system of each factory. The remote video monitoring system is used to call up interfaces of monitoring cameras in different factories. The user can select the corresponding factory in the remote video monitoring system of this platform, and then call up the monitoring cameras in the factory, so as to monitor conditions of the production and the personnel of the factory. The production plan design system is used to provide the user with a production plan table for the currently ongoing project, and the user can perform plan design through the production plan design system and send the design plan to a corresponding responsible party. The prefabricated component production information system is used to summarize the component information produced by all factories. The user can view the related information of the component in the prefabricated component production information system of the platform, such as the amount of concrete, the weight of the component, the volume of the steel bar, the weight of the steel bar, and the amount of steel, the number of sleeves, the number of spreaders, the number of booms, the number of screws, the number of wall holes, the number of electrical boxes, etc.

The intelligent construction site module includes: a remote monitoring unit, an engineering quality unit, a construction site safety unit, a contract planning unit, a cost calculation unit, a component traceability unit, a personnel management unit, and a point cloud scanning unit.

The remote monitoring unit is used for video monitoring of different areas of the construction site. The engineering quality unit is used to display quality-related information, such as the number of hidden dangers, the number of overdue unrectified areas, the number of areas to be rectified, the number of areas to be accepted, and the number of areas that have been closed, and the hidden dangers are classified according to their severity and classified as serious hidden dangers, major hidden dangers and general hidden dangers. In this platform, the hidden dangers of different subcontractors are displayed in the form of histograms. The construction site safety unit is used to show users the safety problems on the construction site in the form of charts, for example, the safety problems existing in the construction site are classified into high-altitude operations, management behaviors, formwork supports, hoisting machinery, three treasures, construction machinery and tools, construction electricity, external scaffolding, and civilized construction, and the above safety issues are displayed in the form of a pie chart. The contract planning unit is used to pre-control the contract recruitment plan, realize the self-powered monitoring and task supervision of the contract recruitment plan, ensure the correct performance of the contract, and realize the structured storage of the contract recruitment, quick query, task supervise, and approve of the process, so as to achieve efficient and practical data. The cost measurement unit is used to correlate with the project image progress, realize multi-level refined management and control of subcontracting, materials, machinery, labor, and expenses, pre-warning, correction, and assisting business personnel to monitor the entire process of cost control and discover risks, and take corresponding measures to save costs and realize profits. The component traceability module realizes the traceability of the full life cycle of the component including design, production, acceptance, and hoisting, through the component two-dimensional code generated by the BIM model. Take a single component as the basic unit body to realize the information aggregation of the whole life cycle of the component. At the same time, the BIM lightweight model is adopted to realize real-time control of the progress of the construction site. Through the virtual construction based on the BIM lightweight model, not only can the component progress be connected to the model in real time, segmented and partitioned, and the progress simulation is performed according to the color partition, but also the simulation information can be associated with PROJECT, the planned progress is compared with the actual progress through the chart and the model association, and the comparison of the construction progress deviation is completed. At the same time, the key node payment plan can be expanded to connect the business module, so as to realize the one-to-one correspondence between the project construction plan and the business payment plan in the key nodes of the project, realize the real-time comparison between the planned payment and the actual payment amount, and realize the generation of each node of the project. Accurate cost control and provide project managers with maximum decision-making information.

The personnel management unit can realize the three-dimensional management of on-site labor personnel by organically combining data of the three major functions of the personnel real-name system, personnel positioning information, and video monitoring information on the platform. Combined with account permission settings and key data summary, it is convenient for managers to control the situation of on-site laborers in real time through visual data. Combined with the front-end biometric gate system, real-time remote monitoring of the number of workers and personnel information on site can be achieved. At the same time, the digital and systematic management of project laborers can be realized through analysis and horizontal comparison of personnel information data.

The point cloud scanning unit can realize centimeter-level quality scanning and real scene modeling of completed indoor engineering through infrared point cloud scanning. At the same time, the scan results are compared with the BIM lightweight model and uploaded to the platform database for filing. Combined with the design information, a construction deviation report is generated, which provides a data basis for the construction quality report. By entering the point cloud scanning results into the database for record, combined with the delivery information, it can also provide three-dimensional data for the owner's house digital instruction manual.

The happy space module is based on VR and panoramic virtual reality technology, and provides services, such as new home delivery, panoramic building manual, panoramic property management navigation, and panoramic building physical examination, and is configured for supporting the VR and panoramic experience at the mobile terminal, and assist in the acceptance and delivery of the house. The happy space module supports the identification of key information such as the location of the property, the surrounding environment, and the house number by scanning the code on the mobile terminal, and can make house selection decisions based on high-quality visualization, and the house selection results can be used to realize data statistics on the platform. Relevant architectural drawings and household parts library can be selected online during the living process, and the information of related maintenance facilities can be visualized online.

Second Embodiment

Figure 2:
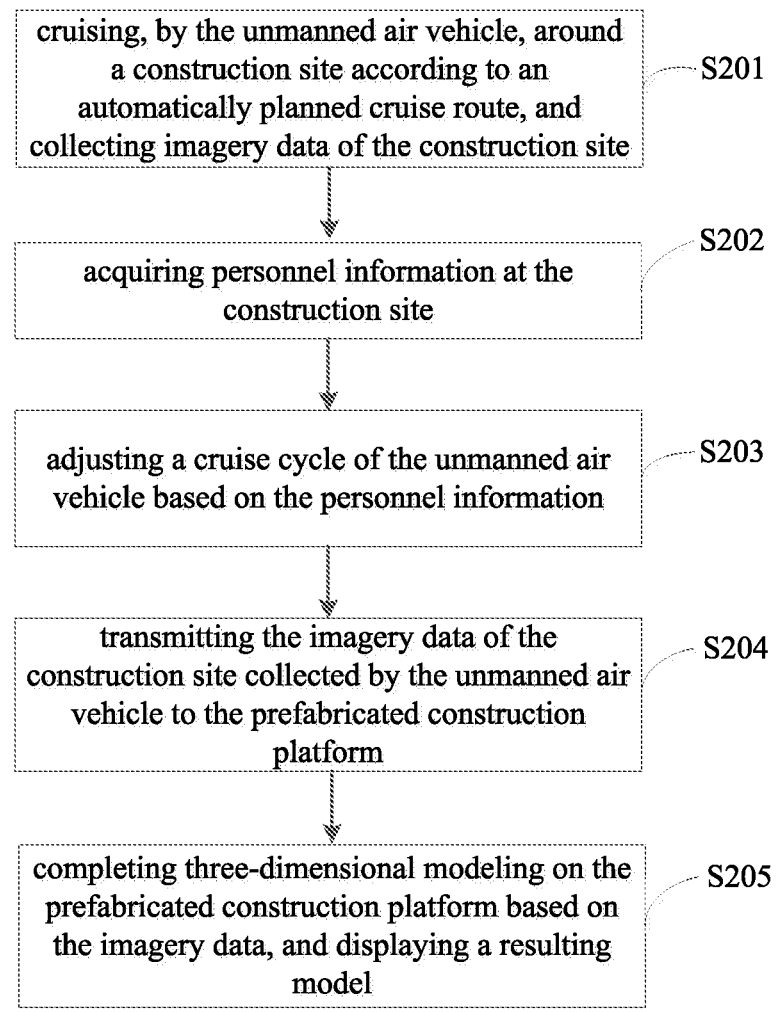
FIG. 2 is a flow chart of implementing a method for controlling cruise of an unmanned air vehicle based on a prefabricated construction platform provided by a second embodiment of the present application.

FIG. 2 is a flow chart of implementing a method for controlling cruise of an unmanned air vehicle based on a prefabricated construction platform provided by a second embodiment of the present application. The present embodiment is a method of specific application of the system provided by the first embodiment.

S201, cruising, by the unmanned air vehicle, around a construction site according to an automatically planned cruise route, and collecting imagery data of the construction site;

In this embodiment, the cruise route of the unmanned air vehicle is planned in advance on the prefabricated construction platform, and a surveying and mapping area is plotted. When a surveying and mapping range is relatively large, the surveying and mapping area can be divided into multiple sub-areas. The division of sub-areas can be performed according to the division of labor of the engineering project. The cruise route planned in advance is transmitted to the unmanned air vehicle. Optionally, the cruise route may also be associated with shooting angle information, such that the unmanned air vehicle is instructed to collect the imagery data at a designated position in the cruise route at a predetermined angle.

S202, acquiring personnel information at the construction site;

In this embodiment, the construction site refers to construction sites that are approved for occupancy for construction activities, including house construction, civil engineering, equipment installation, pipeline laying, etc. for industrial and civil projects, as well as places for safe production, civilized work, and construction, including all areas where construction work can be carried out on the land, in the sea, and in the air. The personnel information includes the number of workers at the construction site, such as the number of management personnel and the number of construction workers at the construction site. Or alternatively, the personnel information may also include grouping information of the workers.

The step of acquiring personnel information at the construction site comprises:

step S2021, acquiring the number of personnel entering the construction site;

step S2022, acquiring the number of personnel leaving the construction site; and step S2023, acquiring the personnel information at the construction site by calculating a difference between the number of personnel entering the construction site and the number of personnel leaving the construction site.

In this embodiment, the construction site includes at least one entrance and at least one exit. Each entrance and each exit of the construction site is equipped with an access control system. The access control system is capable of recognizing the workers entering and exiting the construction site by means of an IC card, fingerprint recognition, face recognition, and other manners. In addition, the access control system is capable of counting the workers who enter and exit the construction site. When N workers enter the construction site through an entrance access control system, the count of a counting unit of the entrance access control system increases by N; and when N workers leave the construction site through an exit access control system, the count of a counting unit of the exit access control system increases by N, where N is an integer greater than one. When the count of the counting unit of the entrance access control system or the exit access control system changes, the changed count value is sent to the prefabricated construction platform, and the prefabricated construction platform determines the number of workers at the construction site by calculating a difference between the number of workers entering the construction site and the number of workers leaving the construction site.

Step S203, adjusting a cruise cycle of the unmanned air vehicle based on the personnel information;

Step S204, transmitting the imagery data of the construction site collected by the unmanned air vehicle to the prefabricated construction platform;

In this embodiment, the prefabricated construction platform is in communication with the unmanned air vehicle and configured to control the unmanned air vehicle to record imagery data of the construction site according to predetermined cruise route and cruise cycle. The unmanned air vehicle refers to a powered air vehicle that does not carry an operator and adopts aerodynamics to provide a required lift for the aircraft, that is capable of performing automatic flight or remote guidance; and that is designed for one-time use or can be recycled. The prefabricated construction platform is configured to control the unmanned air vehicle to photograph the imagery data of buildings at the construction site, where the imagery data includes the image data and/or the video data, and the acquired imagery data is analyzed and monitored, such that the overall monitoring of the buildings are realized, which is suitable for monitoring a facade of the building and the construction site where the structure is constantly changing. The unmanned air vehicle includes a video capture module; the video capture module can be arranged at any position of the unmanned air vehicle, preferably arranged at a bottom of the unmanned air vehicle. The video capture module can be integrated into a hardware system of the unmanned air vehicle, or the video capture module can also be an independent module, that is, the video capture module and the unmanned air vehicle respectively use different processing systems, and data transmission and command transmission between the unmanned air vehicle and the video capture module can be achieved in a wired manner or in a wireless manner. The video capture module can also directly receive the control commands directly sent from the prefabricated construction platform.

The prefabricated construction platform controls the cruise cycle of the unmanned air vehicle based on the number of personnel at the construction site acquired in step S2023. Specifically:

Step S2031, establishing in advance a correspondence relationship between the number of personnel at the construction site and the cruise cycle of the unmanned air vehicle;

Step S2032, finding a corresponding cruise cycle of the unmanned air vehicle based on the acquired number of personnel at the construction site; and Step S2033, controlling, by the prefabricated construction platform, the unmanned air vehicle to cruise according to the found cruise cycle and acquiring the imagery data.

In this embodiment, a database is established in the server of the prefabricated construction platform, and the database is configured to store the number of construction workers at the construction site and the cruise cycle/frequency of the unmanned air vehicle. Since the cruise cycle/frequency of the unmanned air vehicle in the prior art is preset, in case that the current number of construction workers is small, that is, the current construction progress is slow, and the update speed of the building is slow. The photographing according to the preset cycle/frequency may cause a lot of redundancy in the data captured by the unmanned air vehicle, and also increase the loss of the unmanned air vehicle. On the other hand, in case that the current number of the construction workers is relatively large, that is, the current construction progress is relatively fast, the update speed of the building is relatively fast. The photographing according to the preset cycle/frequency may cause insufficient amount of the imagery data captured by the unmanned air vehicle, thus the complete imagery data of the entire life cycle of the prefabricated building cannot be acquired. Therefore, this application proposes to establish in advance a correspondence relationship between the number of construction workers at the construction site and the cruise cycle of the unmanned air vehicle on the prefabricated construction platform. The number of the construction workers at the construction site is negatively related to the cruise cycle of the unmanned air vehicle. In other words, the more the construction workers at the construction site are, the shorter the cruise cycle of the unmanned air vehicle is, and the higher the cruise frequency is; and the fewer the construction workers at the construction site are, the longer the cruise cycle of the unmanned air vehicle is, and the lower the cruise frequency is. As a result, the prefabricated construction platform can dynamically adjust the cruise cycle/frequency of the unmanned air vehicle according to the number of construction workers at the construction site, without the need for the staff of the prefabricated construction platform to manually modify the cruise cycle parameters of the unmanned air vehicle, thus improving the intelligent level of the cruise method of unmanned air vehicle.

Preferably, the number of personnel at the construction site is specifically the number of construction workers. Because there are many people entering and leaving the construction site, including construction workers, management personnel, and maintenance personnel, among them, construction workers are directly involved in the civil construction work, so the number of construction workers is closely related to the update speed of the building. Therefore, in this embodiment, when acquiring the number of personnel at the construction site, only the number of construction workers is acquired, without considering the management personnel and the maintenance personnel. In this way, it is more accurate to adjust the corresponding cruise cycle of the unmanned air vehicle based on the number of personnel at the construction site.

Step S205, completing three-dimensional modeling on the prefabricated construction platform based on the imagery data, and displaying a resulting model.

In this embodiment, when the prefabricated construction platform receives the imagery data collected by the unmanned air vehicle, the prefabricated construction platform performs three-dimensional modeling to generate a three-dimensional model. Based on the three-dimensional model, the user can intuitively acknowledge which phase of the life cycle the building in the construction site is, such that the users can better understand the progress of the project, thereby optimizing work arrangements.

It should be understood that the size of the sequence number of each step in the foregoing embodiment does not mean the sequence of execution. The execution sequence of each process should be determined by its function and internal logic, and should not constitute any limitation to the implementation process of the embodiment of the present application.

Figure 3:
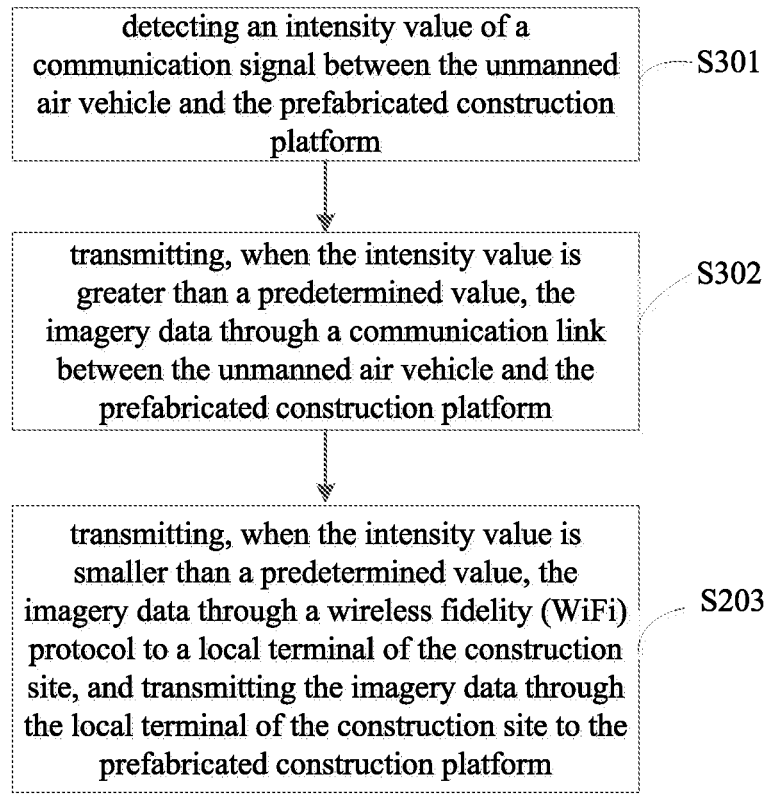
FIG. 3 is a flow chart of implementing another control method provided by the second embodiment of the present application.

Further, as shown in FIG. 3, the step of transmitting the imagery data of the construction site collected by the unmanned air vehicle to the prefabricated construction platform comprises:

Step S301, detecting an intensity value of a communication signal between the unmanned air vehicle and the prefabricated construction platform;

Step S302, transmitting, when the intensity value is greater than a predetermined value, the imagery data through a communication link between the unmanned air vehicle and the prefabricated construction platform; and Step S303, transmitting, when the intensity value is smaller than a predetermined value, the imagery data through a wireless fidelity (WiFi) protocol to a local terminal of the construction site, and transmitting the imagery data through the local terminal of the construction site to the prefabricated construction platform.

In this embodiment, when the unmanned air vehicle collects the imagery data, the intensity of the communication signal between the unmanned air vehicle and the platform is first detected. As a low signal intensity would easily cause missing data, resulting in incompleteness of the collected data and affecting the subsequent three-dimensional reconstruction of the imagery data, in this embodiment, a predetermined intensity value of signal is set, and when it is detected that the intensity value of the communication signal between the unmanned air vehicle and the platform is greater than the predetermined intensity value of signal, the collected imagery data is directly transmitted through a communication link between the unmanned air vehicle and the prefabricated construction platform. When it is detected that the intensity value of the communication signal between the unmanned air vehicle and the platform is smaller than the predetermined intensity value of signal, a WiFi interface of the unmanned air vehicle is activated, and the unmanned air vehicle automatically connects to the local terminal of the construction site through the WiFi interface, thus realizing data transmission with the local terminal of the construction site. After the local terminal of the construction site receives the imagery data transmitted by the unmanned air vehicle, the imagery data can be stored on the local terminal of the construction site or directly transmitted to the prefabricated construction platform.

Figure 4:
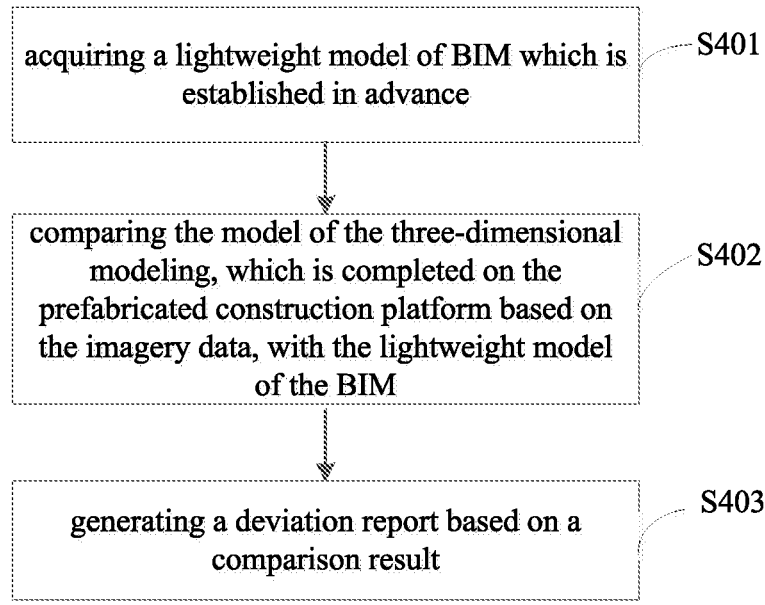
FIG. 4 is a flow chart of implementing another control method provided by the second embodiment of the present application.

Further, as shown in FIG. 4, after completing three-dimensional modeling on the prefabricated construction platform based on the imagery data, and displaying a resulting model, the method further comprises:

Step S401, acquiring a lightweight model of building information modeling (BIM) which is established in advance;

Step S402, comparing the model of the three-dimensional modeling, which is completed on the prefabricated construction platform based on the imagery data, with the lightweight model of the BIM; and Step S403, generating a deviation report based on a comparison result.

In this embodiment, before the on-site construction, the BIM lightweight three-dimensional model of the building is first designed, and the BIM lightweight three-dimensional model is imported into the prefabricated construction platform. Under normal circumstances, after the construction project is completed, the 3D reconstruction model based on the imagery data collected by the air vehicle should be consistent with the BIM lightweight three-dimensional model. In order to ensure the quality of the project, it is required to collect the imagery data of the construction site through the unmanned air vehicle regularly or irregularly during the construction process, build a three-dimensional model on the prefabricated construction platform based on the collected imagery data, and then compare the three-dimensional model with the BIM lightweight three-dimensional model designed before the on-site construction, and finally generate a deviation report based on the comparison result. The deviation report can report the project completion degree and the component deviation rate. For example, by comparing the three-dimensional model established based on the imagery data collected by the unmanned air vehicle with the BIM lightweight three-dimensional model, it can be clearly acknowledged whether the position of a certain component in the current building satisfy a predetermined position in the BIM lightweight three-dimensional model. If the component is not at the predetermined position, then it is considered that the component has position deviation. The number of components with position deviations is calculated, and a total number of currently used components is obtained, so as to calculate the component deviation rate. Thus, the quality of the current construction project can be objectively evaluated.

Further, the step of completing three-dimensional modeling on the prefabricated construction platform based on the imagery data, and displaying a resulting model, comprises:

acquiring models of the three-dimensional modeling completed on the prefabricated construction platform at historical time points; and generating a project growth trend dynamic graph based on the models and the historical time points corresponding to the models.

In this embodiment, the imagery data collected by the unmanned air vehicle is transmitted to the prefabricated construction platform each time, to complete the three-dimensional modeling. The three-dimensional models generated previously are saved on the prefabricated construction platform, and the prefabricated construction platform can also provide an option of generating a project growth trend graph. When the platform staff selects the option of generating a project growth trend graph, the platform generates a dynamic project growth trend graph based on the generated models and the historical time points corresponding to the models, in this way, the staff are allowed to intuitively understand the current completion status of the platform at different time points, which is convenient for the staff to acknowledge the growth trend of the project so as to make the next work arrangement.

Third Embodiment

Figure 5:
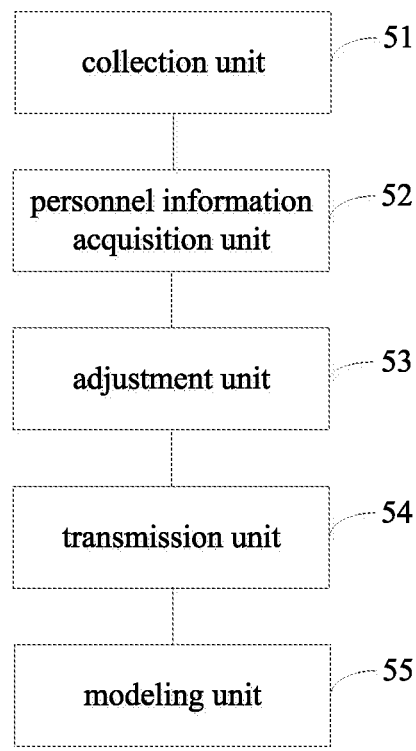
FIG. 5 is a schematic diagram of an apparatus for controlling cruise of an unmanned air vehicle based on a prefabricated construction platform provided by a third embodiment of the present application.

As shown in FIG. 5, which is a schematic diagram of an apparatus for controlling cruise of an unmanned air vehicle based on a prefabricated construction platform provided by a third embodiment of the present application. For facilitating the illustration, only the parts related to the embodiment of the present application are shown.

a collection unit 51, configured for cruising, by the unmanned air vehicle, around a construction site according to an automatically planned cruise route, and collecting imagery data of the construction site;

a personnel information acquisition unit 52, configured for acquiring personnel information at the construction site;

an adjustment unit 53, configured for adjusting a cruise cycle of the unmanned air vehicle based on the personnel information;

a transmission unit 54, configured for transmitting the imagery data of the construction site collected by the unmanned air vehicle to the prefabricated construction platform; and a modeling unit 55, configured for completing three-dimensional modeling on the prefabricated construction platform based on the imagery data, and displaying a resulting model.

Preferably, the imagery data comprises image data and/or video data.

Further, the personnel information acquisition unit 52 comprises:

entering personnel information acquisition unit, configured for acquiring the number of personnel entering the construction site;

exiting personnel information acquisition unit, configured for acquiring the number of personnel leaving the construction site; and a personnel information calculation unit, configured for acquiring the number of personnel at the construction site by calculating a difference between the number of personnel entering the construction site and the number of personnel leaving the construction site.

Furthermore, the transmission unit comprises:

an intensity value detection unit, configured for detecting an intensity value of a communication signal between the unmanned air vehicle and the prefabricated construction platform; and a data transmission unit, configured for:

transmitting, when the intensity value is greater than a predetermined value, the imagery data through a communication link between the unmanned air vehicle and the prefabricated construction platform; and transmitting, when the intensity value is smaller than a predetermined value, the imagery data through a wireless fidelity protocol to a local terminal of the construction site, and transmitting the imagery data through the local terminal of the construction site to the prefabricated construction platform.

Furthermore, the apparatus further comprises: a deviation report generation unit, configured for:

acquiring a lightweight model of building information modeling which is established in advance;

comparing the model of the three-dimensional modeling, which is completed on the prefabricated construction platform based on the imagery data, with the lightweight model of the building information modeling; and generating a deviation report based on a comparison result.

Furthermore, the modeling unit comprises:

a historical data acquisition unit, configured for acquiring models of the three-dimensional modeling completed on the prefabricated construction platform at historical time points; and a trend dynamic graph generation unit, configured for generating a project growth trend dynamic graph based on the models and the historical time points corresponding to the models.

In this embodiment, a correspondence relationship between the number of construction workers at the construction site and the cruise cycle of the unmanned air vehicle is established on the prefabricated construction platform in advance. The number of the construction workers at the construction site is negatively related to the cruise cycle of the unmanned air vehicle. In other words, the more the construction workers at the construction site are, the shorter the cruise cycle of the unmanned air vehicle is, and the higher the cruise frequency is; and the fewer the construction workers at the construction site are, the longer the cruise cycle of the unmanned air vehicle is, and the lower the cruise frequency is. As a result, the prefabricated construction platform can dynamically adjust the cruise cycle/frequency of the unmanned air vehicle according to the number of construction workers at the construction site, without the need for the staff of the prefabricated construction platform to manually modify the cruise cycle parameters of the unmanned air vehicle, thus improving the intelligent level of the cruise method of unmanned air vehicle.

Fourth Embodiment

Figure 6:
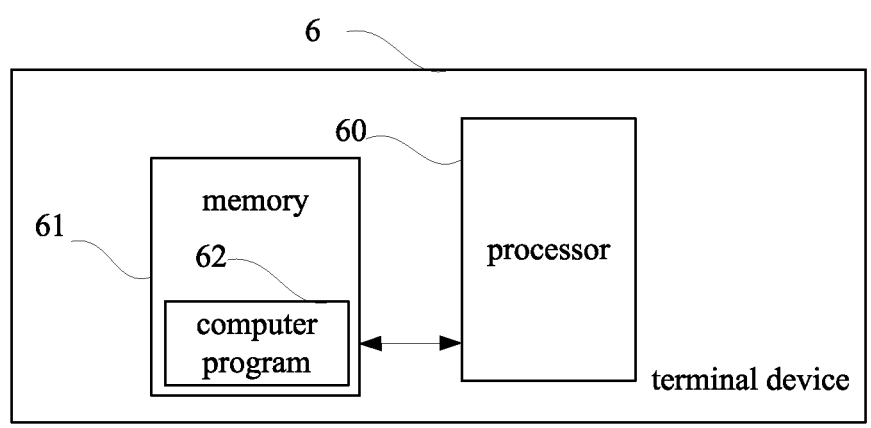
FIG. 6 is a schematic diagram of a terminal device provided by a fourth embodiment of the present application.

FIG. 6 is a schematic diagram of a terminal device provided by an embodiment of the present application. As shown in FIG. 6, the terminal device 6 of this embodiment includes: a processor 60, a memory 61, and a computer program 62 stored in the memory 61 and configured for running on the processor 60. When the processor 60 executes the computer program 62, the steps in the embodiment of the component processing method of each prefabricated building described above are implemented, for example, steps 101 to 103 shown in FIG. 1. Alternatively, when the processor 60 executes the computer program 62, the functions of the modules/units in the foregoing device embodiments, such as the functions of the modules 51 to 53 shown in FIG. 5, are realized.

Exemplarily, the computer program 62 may be divided into one or more modules/units, and the one or more modules/units are stored in the memory 61 and executed by the processor 60 to complete the present application. The one or more modules/units may be a series of computer program instruction segments capable of completing specific functions, and the instruction segments are used to describe the execution process of the computer program 62 in the terminal device 6.

The terminal device 6 may be a computing device, such as a desktop computer, a notebook, a palmtop computer, and a cloud server. The terminal device may include, but is not limited to, a processor 60 and a memory 61. Those skilled in the art may understand that FIG. 6 is only an example of the terminal device 6, rather than limiting the terminal device 6, and may include more or less components than those illustrated, or combine some components, or different components. For example, the terminal device may also include an input/output device, a network access device, a bus, and so on.

The processor 60 may be a central processing unit (CPU), a general purpose processor, a digital signal processor (DSP), an application specific integrated circuit (ASIC), a field-programmable gate array (FPGA), a programmable logic device, a discrete gate or a transistor logic device, a discrete hardware component, etc. The general purpose processor may be a microprocessor or the processor may also be any conventional processor, etc.

The memory 61 may be an internal storage unit of the terminal device 6, such as a hard disk or a memory of the terminal device 6. The memory 61 may also be an external storage device of the terminal device 6, such as a plug-in hard disk, a smart media card (SMC), a secure digital (SD) card, a flash card, etc. provided on the terminal device 6. Further, the memory 61 may further include both an internal storage unit and an external storage device of the terminal device 6. The memory 61 is used to store the computer program and other programs and data required by the terminal device. The memory 61 may also be used to temporarily store data that has been or will be output.

Those skilled in the art may clearly understand that, for the convenience and simplicity of description, only the division of the above functional modules is used as an example. In practical applications, the above function allocation may be accomplished by different functional modules as needed. That is to say, the internal structure of the device is divided into different functional modules to accomplish all or part of the functions described above. Various functional units and modules in some embodiments may be integrated in one processing module, or the various units and modules may exist in a single physical manner, or two or more units and modules may be integrated in one module. The above integrated unit/module may be implemented in the form of hardware, or may be implemented in the form of a software functional unit. In addition, the specific names of the various functional units and modules are merely for the convenience of distinguishing each other and are not intended to limit the protection scope of the present application. For the specific working process of the unit and module in the foregoing system, reference may be made to the corresponding process in the foregoing method embodiment, which will not be described herein again.

In the above embodiments, the description of different embodiments has different focus, and the parts that are not described or recorded in some embodiments may refer to the related descriptions in other embodiments.

It may be appreciated by those skilled in the art that the units and algorithm steps of each example described in combination with the embodiments disclosed herein are capable of being implemented by electronic hardware or a combination of computer software and electronic hardware. Whether these functions are implemented by hardware or software depends on the specific application and design constraints of the technical solutions. Those skilled in the art may use different methods to implement the described functions for each particular application, but such implementation should not be considered to go beyond the scope of the present application.

In the embodiments provided by the present application, it should be understood that the disclosed apparatus/terminal device and method may be implemented in other manners. For example, the apparatus/terminal device embodiments described above are merely exemplary. For example, the division of the modules or units is merely logical function division, and there may be other division manners in actual implementation. For example, multiple units or components may be combined or integrated into another system, or some of the features may be ignored or not implemented. In addition, the mutual coupling or direct coupling or communication connection shown or discussed may be indirect coupling or communication connection through some interfaces, devices or units, and may be in electrical, mechanical, or other forms.

The units described as separate components may or may not be physically separated. The components displayed as units may or may not be physical units. That is to say, the components may be located in one place or may also be distributed to multiple network units. Some or all of the units may be selected according to actual needs to achieve the objectives of the solution in this embodiment.

In addition, each of the function units in different embodiments of the present application may be integrated in one processing unit, or each of the units may exist in a single physical manner, or two or more units may be integrated in one unit. The above integrated unit may be implemented in the form of hardware or may be implemented in the form of a software function unit.

If implemented in the form of a software function unit and when sold or used as an independent product, the integrated module/unit may be stored in a computer readable storage medium. Based on this understanding, all or a part of the processes of the present application for implementing the above exemplary method may also be implemented by instructing relevant hardware through a computer program. The computer program may be stored in a computer readable storage medium. The computer program, when being executed by the processor, may implement steps in each of the method embodiments described above. Herein, the computer program includes a computer program code, which may be in the form of a source code, in the form of an object code, in the form of an executable file or in some intermediate form, etc. The computer readable medium may include any entity or device capable of carrying the computer program code, a recording medium, a USB flash drive, a removable disk, a magnetic disk, an optical disk, a computer memory, a read-only memory (ROM), a random access memory (RAM), electrical carrier signals, telecommunications signals, a software distribution medium, etc. It should be noted that the content contained in the computer readable medium may be appropriately increased or decreased according to the requirements of legislation and patent practice in the jurisdiction. For example, in some jurisdictions, according to legislation and patent practice, a computer readable medium excludes electric carrier signals and telecommunication signals.

The foregoing embodiments are merely intended for describing the technical solutions of the present application rather than limiting the present application. Although the present application is described in detail with reference to the foregoing embodiments, it should be understood by those skilled in the art that the technical solutions recorded in each of the foregoing embodiments may still be modified or some of the technical features may be replaced equivalently. These modifications or replacements do not make the essence of the corresponding technical solutions depart from the spirit and scope of the technical solutions of each of the embodiments of the present application, and should be included within the protection scope of the present application.

What is claimed is:

1. A method for controlling cruising of an unmanned air vehicle based on a prefabricated construction platform, the unmanned air vehicle being in communication with the prefabricated construction platform, the method comprising:
   cruising, by the unmanned air vehicle, around a construction site according to an automatically planned cruise route, and collecting imagery data of the construction site;
   acquiring, by the prefabricated construction platform, personnel information at the construction site;
   adjusting, by the prefabricated construction platform, a cruise cycle of the unmanned air vehicle based on the personnel information;
   transmitting the imagery data of the construction site collected by the unmanned air vehicle to the prefabricated construction platform; and
   completing three-dimensional modeling on the prefabricated construction platform based on the imagery data, and displaying a resulting model,
   wherein said acquiring the personnel information at the construction site comprises:
   acquiring a number of personnel entering the construction site;
   acquiring a number of personnel leaving the construction site; and
   acquiring a number of personnel at the construction site by calculating a difference between the number of personnel entering the construction site and the number of personnel leaving the construction site,
   wherein said adjusting the cruise cycle of the unmanned air vehicle based on the personnel information comprises:
   establishing in advance a correspondence relationship between the number of personnel at the construction site and the cruise cycle of the unmanned air vehicle, wherein the correspondence relationship is established in such a way that the number of personnel at the construction site is negatively related to a length of the cruise cycle of the unmanned air vehicle;
   finding a corresponding cruise cycle of the unmanned air vehicle based on the acquired number of personnel at the construction site; and
   controlling, by the prefabricated construction platform, the unmanned air vehicle to cruise according to the found cruise cycle and acquiring the imagery data.

2. The control method of claim 1, wherein said transmitting the imagery data of the construction site collected by the unmanned air vehicle to the prefabricated construction platform comprises:
   detecting an intensity value of a communication signal between the unmanned air vehicle and the prefabricated construction platform;
   transmitting, when the intensity value is greater than a predetermined value, the imagery data through a communication link between the unmanned air vehicle and the prefabricated construction platform; and
   transmitting, when the intensity value is smaller than a predetermined value, the imagery data through a wireless fidelity protocol to a local terminal of the construction site, and transmitting the imagery data through the local terminal of the construction site to the prefabricated construction platform.

3. The control method of claim 1, further comprising, after completing the three-dimensional modeling on the prefabricated construction platform based on the imagery data, and displaying the resulting model:
   acquiring a predetermined model of building information modeling;
   comparing the model of the three-dimensional modeling which is completed on the prefabricated construction platform based on the imagery data, with the predetermined model of the building information modeling; and
   generating a deviation report based on a comparison result.

4. The control method of claim 1, wherein said completing the three-dimensional modeling on the prefabricated construction platform based on the imagery data, and displaying the resulting model, comprises:
   acquiring models of the three-dimensional modeling completed on the prefabricated construction platform at historical time points; and
   generating a project growth trend dynamic graph based on the models and the historical time points corresponding to the models.

5. The control method of claim 1, wherein the imagery data comprises image data and/or video data.

6. A terminal device, comprising: a memory, a processor, and a computer program stored in the memory and running on the processor, wherein the processor, when executing the computer program, is configured to perform operations for controlling cruising of an unmanned air vehicle based on a prefabricated construction platform, wherein the unmanned air vehicle is in communication with the prefabricated construction platform, and the operations comprise:
   cruising, by the unmanned air vehicle, around a construction site according to an automatically planned cruise route, and collecting imagery data of the construction site;
   acquiring, by the prefabricated construction platform, personnel information at the construction site;
   adjusting, by the prefabricated construction platform, a cruise cycle of the unmanned air vehicle based on the personnel information;
   transmitting the imagery data of the construction site collected by the unmanned air vehicle to the prefabricated construction platform; and
   completing three-dimensional modeling on the prefabricated construction platform based on the imagery data, and displaying a resulting model,
   wherein the operation of acquiring the personnel information at the construction site comprises:
   acquiring a number of personnel entering the construction site;
   acquiring a number of personnel leaving the construction site; and
   acquiring a number of personnel at the construction site by calculating a difference between the number of personnel entering the construction site and the number of personnel leaving the construction site,
   wherein the operation of adjusting the cruise cycle of the unmanned air vehicle based on the personnel information comprises:

establishing in advance a correspondence relationship between the number of personnel at the construction site and the cruise cycle of the unmanned air vehicle, wherein the correspondence relationship is established in such a way that the number of personnel at the construction site is negatively related to a length of the cruise cycle of the unmanned air vehicle;

finding a corresponding cruise cycle of the unmanned air vehicle based on the acquired number of personnel at the construction site; and controlling, by the prefabricated construction platform, the unmanned air vehicle to cruise according to the found cruise cycle and acquiring the imagery data.

7. The terminal device of claim 6, wherein the operation of transmitting the imagery data of the construction site collected by the unmanned air vehicle to the prefabricated construction platform comprises:

detecting an intensity value of a communication signal between the unmanned air vehicle and the prefabricated construction platform;

transmitting, when the intensity value is greater than a predetermined value, the imagery data through a communication link between the unmanned air vehicle and the prefabricated construction platform; and transmitting, when the intensity value is smaller than a predetermined value, the imagery data through a wireless fidelity protocol to a local terminal of the construction site, and transmitting the imagery data through the local terminal of the construction site to the prefabricated construction platform.

8. The terminal device of claim 6, wherein, after completing the three-dimensional modeling on the prefabricated construction platform based on the imagery data, and displaying the resulting model, the operations further comprise:

acquiring a predetermined model of building information modeling;

comparing the model of the three-dimensional modeling which is completed on the prefabricated construction platform based on the imagery data, with the predetermined model of the building information modeling; and generating a deviation report based on a comparison result.

9. The terminal device of claim 6, wherein the operation of completing the three-dimensional modeling on the prefabricated construction platform based on the imagery data, and displaying the resulting model, comprises:

acquiring models of the three-dimensional modeling completed on the prefabricated construction platform at historical time points; and generating a project growth trend dynamic graph based on the models and the historical time points corresponding to the models.

10. The terminal device of claim 6, wherein the imagery data comprises image data and/or video data.

* * * * *